United States Patent [19]

Miller et al.

[11] Patent Number: 4,683,024

[45] Date of Patent: Jul. 28, 1987

[54] DEVICE FABRICATION METHOD USING SPIN-ON GLASS RESINS

[75] Inventors: David A. Miller, Seaside Park; Joseph M. Moran, Berkeley Heights; Gary N. Taylor, Bridgewater, all of N.J.

[73] Assignee: American Telephone and Telegraph Company, AT&T Bell Laboratories, Murray Hill, N.J.

[21] Appl. No.: 697,645

[22] Filed: Feb. 4, 1985

[51] Int. Cl.⁴ .................. B44C 1/22; C03C 15/00; C03C 25/06
[52] U.S. Cl. .................. 156/643; 156/646; 156/652; 156/657; 156/661.1; 156/668; 156/904; 204/192.32; 427/38; 427/43.1; 430/317

[58] Field of Search .............. 156/643, 644, 646, 652, 156/653, 655, 657, 659.1, 661.1, 662, 668, 904; 430/313, 316, 317; 427/38, 39, 43.1, 88; 204/192 E; 29/580, 591

[56] References Cited

U.S. PATENT DOCUMENTS 4,244,799  1/1981  Fraser et al. .................. 156/659.1 X Primary Examiner—William A. Powell
Attorney, Agent, or Firm—Bernard Tiegerman

[57] ABSTRACT

A new method for fabricating a device, such as a semiconductor device, is disclosed. The method includes the step of patterning a substrate with a trilevel resist containing a spin-deposited substitute for the conventional central, silicon dioxide region. This substitute includes an organosilicon glass resin in combination with metal- and-oxygen containing material. The inventive method prevents the losses of linewidth control, and avoids the pattern degradation due to undesirably many pinholes, of previous such methods.

7 Claims, 6 Drawing Figures

DEVICE FABRICATION METHOD USING SPIN-ON GLASS RESINS

BACKGROUND OF THE INVENTION

1. Field of the Invention

The invention pertains to lithographic processes for fabricating devices.

2. Art Background

Lithographic processes play an important role in the manufacture of devices such as semiconductor devices. During the manufacture of these devices, lithographic processes are used to pattern substrates such as silicon wafers or processed silicon wafers which are, for example, wholly or partially covered by metal, silicon dioxide, or polycrystalline silicon. For example, a substrate is coated with an energy-sensitive material called a resist. Selected portions of the resist are exposed to a form of energy which either removes the exposed portions to bare portions of the substrate or more typically induces a change in the solubility or reactivity of the exposed portions in relation to a given developing agent or etchant. The more soluble or reactive portions of the resist are removed and portions of the substrate are bared by applying the developing agent or etchant to the resist. The bared portions of the substrate are then treated, e.g., are etched, implanted, or metallized.

Organic polymer resists are presently the most commonly employed commercial resists. It is desirable in using these resists to achieve a high resolution pattern with good linewidth control (e.g., a pattern having linewidths smaller than about 1.5 $\mu m$ and linewidth variations smaller than about 10 percent). This requisite generally requires that the resist have a thickness which is both small (less than about 1 $\mu m$) and substantially uniform (thickness variations should be less than about 10 percent). Resist layers having small, substantially uniform thicknesses are readily formed on substrates having planar surfaces, e.g., the surface of an unprocessed silicon wafer, using conventional spin-deposition techniques. But in the case of substrates having nonplanar surfaces, e.g., the stepped surface of a processed silicon wafer, the necessary thickness uniformity is generally achieved using relatively thick resist layers that preclude the formation of high resolution patterns.

The desire to achieve high resolution patterns with good linewidth control in substrates having nonplanar surfaces has led to the use of multi-level, e.g., trilevel, resist configurations. Typically, in these configurations, a layer of an organic polymer (which need not be energy-sensitive), e.g., a novolac resin, thick enough to yield a planar surface, is spin-deposited onto a nonplanar substrate surface. (Planar, in this context, means that a tangent plane to any point of the upper surface of the planarizing layer forms an angle with a least-squares-fit planar approximation to the substrate surface which is less than or equal to about 30 degrees.) A layer of silicon dioxide is deposited onto the planarizing layer using conventional rf sputtering or plasma-enhanced chemical vapor deposition (CVD) techniques. Then, a layer of energy-sensitive material, typically organic polymer resist, e.g., photoresist, e-beam resist, ion beam resist, or x-ray resist, thin enough to yield the desired resolution, is spin-deposited onto the silicon dioxide layer. A desired pattern (to be transferred into the substrate) is defined in the top resist layer by conventional exposure and development. This pattern is then dry etched, e.g., plasma etched or reactive ion etched, into the underlying silicon dioxide layer using a plasma which includes fluorine-containing etchant species, such as a plasma struck in an atmosphere containing $CHF_3$ and $O_2$ (or air), while employing the patterned top resist layer as an etch mask. The patterned silicon dioxide layer is in turn used as an etch mask during the reactive ion etching of the underlying planarizing layer, the etching occurring in a plasma struck in, for example, an $O_2$ atmosphere. The patterned resist is finally employed to process the substrate by using the patterned planarizing layer as a mask, e.g., an etch, implantation, or metallization mask.

The trilevel resist has proven to be highly useful for patterning substrates having planar and/or nonplanar surfaces. However, a desire to reduce processing cost has precipitated a search for materials which are functionally equivalent to the silicon dioxide but which are deposited by relatively inexpensive techniques.

Materials which have been considered as alternatives to silicon dioxide include organosilicon glass resins which are deposited using inexpensive, conventional spin-deposition techniques. (An organosilicon glass resin, for present purposes, is a polymer, having a noncrystalline structure, which includes silicon, oxygen, carbon and hydrogen.) After baking, these spin-on glass resins have etch characteristics essentially equivalent to those of silicon dioxide, e.g., they are readily plasma or reactive ion etched in, for example, $CHF_3$ and $O_2$ (or air) plasmas.

Unfortunately, the organosilicon glass resins undergo lateral (transverse to the depth direction) etching during the etching, e.g., $O_2$ reactive ion etching, of the planarizing layer. This lateral etching, which typically occurs at a rate equal to or greater than about 0.05 $\mu m$/minute, results in not entirely advantageous linewidth control during etching of the planarizing layer. Variations in linewidth greater than about 10 percent (produced during the etching of the planarizing layer) are generally observed.

Materials containing tantalum or titanium atoms chemically bound to oxygen atoms have also been considered as substitutes for silicon dioxide. It is possible to deposit these materials by conventional spin-deposition techniques, and they undergo relatively little (as compared to the spin-on glass resins) lateral etching during the etching of the planarizing layer. But relatively thick (thicker than about 0.05 $\mu m$) layers of some of these materials tend to crack during processing. Moreover, these materials often etch relatively slowly (compared to the organosilicon glass resins) in a plasma struck in, for example, $CHF_3$ and $O_2$ (or air). Consequently, the relatively thin, top resist layer (which functions as the etch mask for these materials) undergoes significant degradation during the etching of these materials, which also results in a loss of linewidth control during pattern transfer into the substrate. Relatively thin (thinner than about 0.05 $\mu m$) layers of these materials (which are etched in less time than thick layers) have been used to avoid this problem. However, these layers have many pinholes (more than about 10/$cm^2$) that produce unwanted features during pattern transfer. Thus, these materials are not now being actively investigated.

Alternatives to the silicon dioxide layer of the trilevel resist which are formed using relatively inexpensive techniques, which do not lead to a loss of linewidth control, and are substantially free of defects such as pinholes have not been found.

SUMMARY OF THE INVENTION

The invention involves a substitute for the silicon dioxide layer (of the trilevel resist) which avoids the losses of linewidth control associated with previous substitutes, which is substantially free of pinholes extending through its thickness, and is readily deposited using conventional techniques such as conventional spin-deposition techniques. A combination of unacceptable silicon dioxide substitutes, i.e., a combination of organosilicon glass resin and a material containing metal chemically bound to oxygen, surprisingly yields quite acceptable results. For example, a layer of an organosilicon glass resin overlying a layer of material containing metal atoms chemically bound to oxygen atoms is employed. Lateral etching of the organosilicon glass resin during the etching of the planarizing layer does occur. However, there is relatively little lateral etching of the underlying layer of metal-and-oxygen containing material, and it is this layer which determines linewidths during the etching of the bottom planarizing layer. Further, the metal-and-oxygen containing layer is chosen to be thin enough so that the silicon dioxide substitute is etched through its thickness (when being patterned) in less than about 15 minutes, which precludes significant degradation of the top resist layer. Thus, losses of linewidth control are avoided. In addition, no significant pattern degradation due to pinholes occurs.

BRIEF DESCRIPTION OF THE DRAWINGS

The invention is described with reference to the accompanying drawings, wherein.

DETAILED DESCRIPTION

The invention involves a method for fabricating devices, such as semiconductor devices, and the devices produced using this method.

Figure 1:
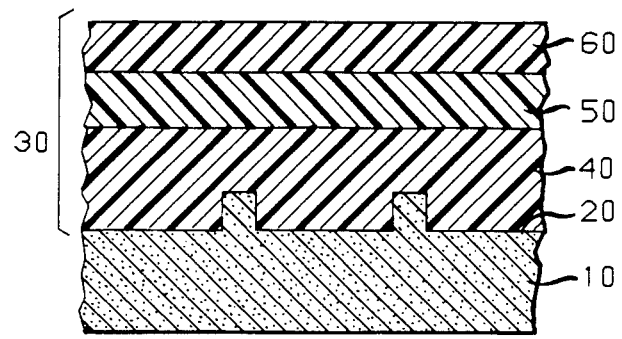
FIGS. 1-5 are cross-sectional views of a substrate undergoing processing in accordance with the inventive device fabrication method.
Figure 2:
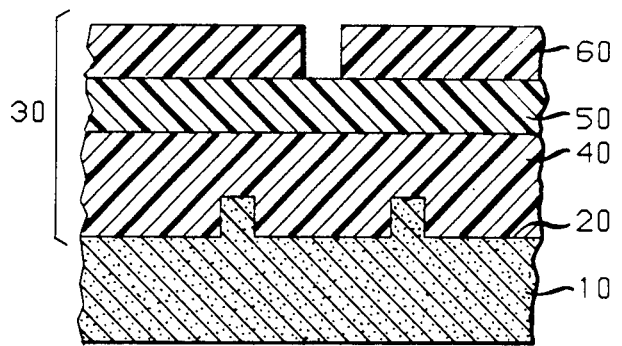
Figure 3:
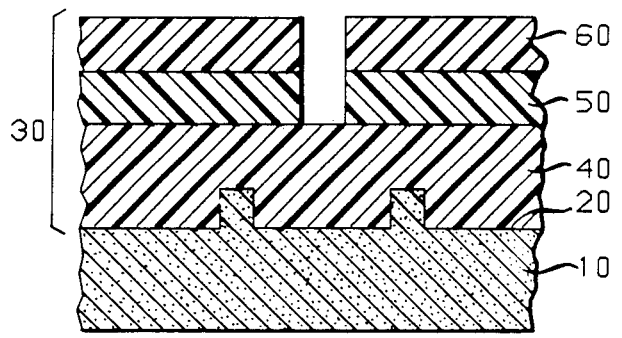
Figure 4:
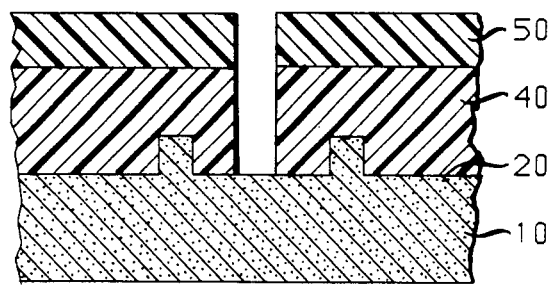
Figure 5:
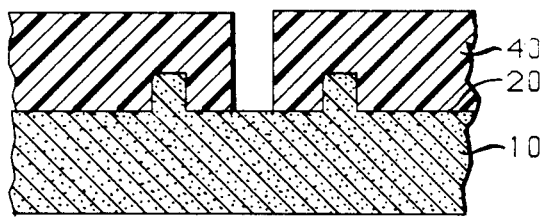

The inventive fabrication method includes the step of patterning a substrate 10 (see FIG. 1) having either a planar or nonplanar (as depicted in FIG. 1), e.g., stepped, surface 20. This patterning is achieved by using a tri-level resist 30 which includes a silicon dioxide substitute that is capable of being spin-deposited. That is, the resist 30 includes a planarizing region 40 which overlies the surface 20, the silicon dioxide substitute region 50 which overlies the region 40, and a region 60 of energy-sensitive material which overlies the region 50. The region 40 includes, for example, a novalc resin, which is readily spin-deposited. The region 60 includes, for example, a conventional organic polymer resist, e.g., photoresist, e-beam resist, ion beam resist, or x-ray resist, which is also readily spin-deposited.

As depicted in FIGS. 2-5, a pattern to be defined in the substrate 10 is initially formed in the energy-sensitive region 60 using conventional techniques. With the patterned region 60 acting as an etch mask, the region 50 is then dry etched, e.g., plasma etched, reactive ion etched, or reactive ion beam etched, with a plasma struck in, for example, a fluorine-containing gas, such as a plasma struck in an atmosphere of $CHF_3$ and $O_2$ (or air). The patterned region 50, in turn, serves as an etch mask during the reactive ion etching or reactive ion beam etching of the planarizing region 40 in a plasma struck in, for example, an $O_2$-containing atmosphere. Finally, the substrate 10 is processed by using the patterned region 40 as a mask, e.g., an etch, implantation, or metallization mask.

Unlike the silicon dioxide substitutes used in previous fabrication methods, the silicon dioxide substitute 50 includes a combination of at least two individually unacceptable silicon dioxide substitutes, i.e., the combination of (1) an organosilicon glass resin having silicon atoms chemically bound to oxygen atoms and (2) a material, resistant to etching by fluorine species, containing metal atoms, such as titanium and tantalum atoms, also chemically bound to oxygen atoms. A preferred combination is a layer of organosilicon glass resin overlying a layer of inorganic material containing metal atoms chemically bound to oxygen atoms. An even more preferred combination is a layer which includes a mixture of organosilicon glass resin and metal-and-oxygen containing material overlying a layer of metal-and-oxygen containing material. However, embodiments which include a single layer containing the two substitutes are not precluded.

The exact mechanistic foundation for the synergistic effect obtained by using two unacceptable materials to produce a totally acceptable material is unknown. However, it has now been found that fluorine-containing materials are formed during the patterning of the organosilicon glass and remain in the etching chamber, even after patterning, through adhesion to the chamber walls. During the subsequent etching of the planarizing layer, fluorine-containing etchants are released and, in the absence of a layer resistant to these etchants, produce the previously discussed undesirable lateral etching. By inserting a fluorine etchant-resistant region, lateral etching is reduced, and thus linewidth loss is reduced. For example, materials containing metal atoms chemically bound to oxygen atoms are etched relatively slowly (compared to the organosilicon glass resins) by the fluorine-containing etchant species, i.e., they are etched at a rate less than about 0.007 $\mu m/minute$ by these etchant species. Thus, by combining an organosilicon glass resin with metal-and-oxygen containing material, substantial resistance to lateral etching by the fluorine-containing etchant species is achieved, i.e., variations in linewidth less than or equal to about 10 percent are achieved during the etching of the planarizing region 40.

The time required to pattern, i.e., etch through the thickness of, the silicon dioxide substitute region 50 with a given etchant is largely determined by the composition and thickness of the region 50. During the etching of this region, the energy-sensitive region 60 (which functions as the etch mask for the region 50), is also exposed to the etchant, and is thus susceptible to degradation which, if it occurs, leads to a loss of linewidth control. It has been found that the region 60 (having the typical thicknesses described below) is substantially unaffected by the etchants used to etch the region 50, i.e., variations in linewidth less than or equal to about 10 percent are achieved during the etching of the region 50, provided the region 50 is etched through its thickness in a time less than about 15 minutes. This etching time is readily achieved provided the amount of metal-and-oxygen containing material incorporated into, and/or the thickness of, the region 50 is not excessive. In general, the relative amounts of the two constituents of the silicon dioxide substitute 50 is strongly dependent on, for example, the etchants and etching conditions employed. Typically, ratios of organosilicon resin material to metal-and-oxygen containing material in the range of about 2 percent to about 15 percent (by volume) are useful. However, the exact ratio, and the thickness of region 50, suitable for maintaining a desired degree of linewidth control is determined by employing a control sample.

It has also been found that the pattern etched into the planarizing region 40, while using the region 50 as an etch mask, is substantially identical to the pattern defined in the energy-sensitive region 60. That is, it has been found that the silicon dioxide substitute is substantially free of pinholes extending through its thickness, i.e., has less than or equal to about 2 pinholes/$cm^2$ extending through its thickness, and thus errors in pattern transfer, e.g., undesirable pinhole patterns, are avoided. For example, when using a layer of an organosilicon glass resin overlying a layer of metal-and-oxygen containing material, any pinholes present in the former layer will generally not overlie pinholes present in the latter layer, and consequently the combination of the two layers has far fewer pinholes extending through its thickness than either of the individual layers.

The inventive silicon dioxide substitute not only avoids the known problems associated with the previous substitutes, but also provides a solution to a newfound problem associated with the previous substitutes. This newfound problem is a lack of adhesion between many of the conventional organosilicon glass resins and the planarizing region 40. This lack of adhesion leads to undesirable defects in the glass resin which, in turn, leads to significant errors during subsequent processing. The presence of the metal-and-oxygen containing material in the inventive silicon dioxide substitute promotes adhesion between the substitute and the planarizing region 40, largely preventing the defects associated with the previous silicon dioxide substitutes. A contemplated explanation for this behavior involves interface interactions. The planarizing region 40 is commonly an organic resin, e.g., a novalac resin, whose upper surface is hydrophilic, i.e., includes OH (hydrogen bonding) and/or polar groups (groups having a dipole moment greater than about 1.2 Debye) such as ketones, aldehydes, and nitro groups. Before baking, the conventional organosilicon resins are also hydrophilic, and they adhere to the underlying organic resin. After baking, these organosilicon resins generally become hydrophobic, resulting in stress at the organosilicon resin-organic resin interface. This stress produces defects, such as circular ridges, protruding from the upper surface of the organosilicon glass resin. When etching through the nominal thickness of the glass resin, the etching time is generally insufficient to etch through the thickness of the protruding circular ridges, and an undesirable defect pattern is formed.

The organosilicon glass resins useful in the invention are typically thermosetting (the application of heat produces cross-linking) resins. After being spin-deposited, typically at room temperature (about 23 degrees Centigrade (C.)), the deposited thermosetting resins are baked at temperatures of as much as about 200 degrees C. for about 30 minutes. This baking procedure serves to substantially fully cure (effect cross-linking of) the deposited material, and evolve gases from the material, to prevent cracking during subsequent processing. To ensure that the resin does not become a rubber either during deposition or during the baking procedure, the resin is chosen to have a glass transition temperature which increases, during baking, from a value above the deposition temperature to a value above the peak baking temperature. (A resin which becomes a rubber during the deposition or baking procedure is undesirable because the rubber tends to crack, or cause the overlying region 60 to crack, during subsequent processing.)

Additionally, the amount of chemically bound (to each other) silicon and oxygen in a glass resin should be equal to or greater than about 60 percent by weight (solids). Quantities less than about 60 percent are undesirable because this results in an undesirably low etch selectivity between the organosilicon glass resin and the overlying region 60, during the plasma etching (in an atmosphere of, for example, $CHF_3$ and $O_2$) of the glass resin. Quantities less than about 60 percent are also undesirable because they result in glass resins which erode undesirably quickly during the $O_2$-reactive ion etching of the planarizing region 40.

Figure 6:
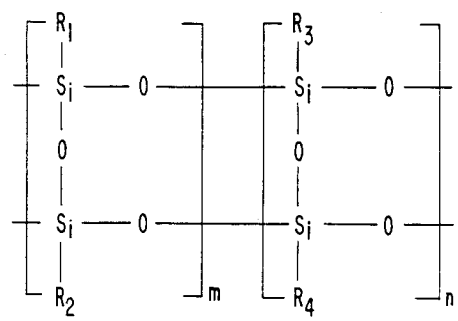
FIG. 6 depicts the general structure of the siloxane ladder polymers useful in the invention.

Useful glass resin materials (having the above properties) include siloxane ladder polymers having the general structures depicted in FIG. 6. Constituents denoted by the symbols $R_1$ and $R_2$ in FIG. 6 are, for example, alkyl, aryl, and aralkyl. The constituents denoted by the symbols $R_3$ and $R_4$ are, for example, the same constituents specified for $R_1$ and $R_2$ with, or without, pendent alkoxy and/or hydroxyl groups. These siloxane ladder polymers are readily formed by, for example, reacting mixtures of alkoxysilanes with water. In addition, useful siloxane ladder polymers are commercially available and include, for example, the material sold under the trade name GR650 by the Owens-Illinois Company of Toledo, Ohio.

Metal-and-oxygen containing materials, useful in the invention, include oligomeric or polymeric forms of hydrolyzed or partially hydrolyzed metal halides and metal alkoxides, e.g., tantalum chloride, tantalum ethoxide, titanium chloride, and titanium ethoxide. It has been found that the amount of chemically bound (to each other) metal and oxygen in these materials should be equal to or greater than about 90 percent (by weight solids). Amounts less than about 90 percent are undesirable because they result in an undesirably low etch selectivity between the metal-and-oxygen containing material and the thick planarizing region 40 during the etching of the region 40. Metal-and-oxygen containing materials which meet this limitation, which are readily spin-deposited, and which are commercially available include, for example, the tantalum ethoxide sold by the Alfa Products Company of Danvers, Mass.

As a pedagogic aid to an even more complete understanding of the invention, the application of one embodiment of the inventive fabrication method to the patterning of the substrate 10 (see FIGS. 1-5), is described below.

In patterning the substrate 10, a relatively thick, planarizing region 40 is initially formed, e.g., spin-deposited, on the surface 20. The region 40 includes, for example, a conventional organic polymer such as a novalac resin. If the height of the steps in the surface 20 is, for example, about 1 $\mu$m, then the thickness of the region 40 ranges from about 1 $\mu$m to about 3 $\mu$m. A thickness less than about 1 $\mu$m is undesirable because it generally produces undesirably poor step coverage. On the other hand, a thickness greater than about 3 $\mu$m is undesirable because it results in an undesirably long etch time for the region 40, producing undesirable degradation of region 50, and consequential loss of linewidth control.

The region 50 is formed over the upper surface of the planarizing region 40 by initially spin-depositing a metal-and-oxygen containing material onto the upper surface of the region 40. This spin-deposited material includes, for example, tantalum ethoxide. The thickness of this material is preferably less than or equal to about 0.06 μm (after curing). A thickness greater than about 0.06 μm is undesirable because it results in an undesirably long (longer than about 15 minutes) etch (patterning) time for the region 50, which ultimately results in a loss of linewidth control during pattern transfer into the substrate. Such large thicknesses are also undesirable because they often result in cracks developing in the deposited material during subsequent processing.

A region which includes, for example, a mixture of organosilicon glass resin and metal-and-oxygen containing material, e.g., a mixture of GR650 and tantalum ethoxide, is now spin-deposited onto the upper surface of the metal-and-oxygen containing material. Preferably, the amount of metal-and-oxygen containing material in the mixture ranges from about 0.2 percent to about 1 percent (by weight). Amounts less than about 0.2 percent, while not precluded, are less desirable because the resulting mixtures tend to exhibit more defects than are preferable. Amounts greater than about 1 percent are undesirable because the resulting mixtures exhibit an undesirably short shelf life (typically less than about 15 minutes) and an undesirably large amount of precipitates. The thickness of the deposited mixture ranges from about 0.1 μm to about 0.3 μm. A mixture having a thickness less than about 0.1 μm is undesirable because it often has undesirably many defects, e.g., undesirably many pinholes, and is readily degraded during the etching of the planarizing region 40. A mixture having a thickness greater than about 0.3 μm is undesirable because it requires an undesirably long etching time, producing undesirable degradation of the energy-sensitive region 60, and consequential loss of linewidth control.

The spin-deposited region 50 is baked at a temperature ranging from about 160 degrees C. to about 240 degrees C., for a period of time ranging from about 5 minutes to about 30 minutes. A temperature less than about 160 degrees C. coupled with a baking period less than about 5 minutes is undesirable because it results in imcompletely cured, and thus unstable, resin. Further, a temperature greater than about 240 degrees C. coupled with a baking period greater than about 30 minutes is undesirable because this results in undesirable degradation of the underlying materials.

After forming, e.g, spin-depositing, an energy-sensitive region 60 overlying the region 50, a desired pattern is formed in the region 60 employing conventional exposure and development tools. Using the patterned region 60 as an etch mask, the region 50 is now etched in a plasma struck in an atmosphere containing $CHF_3$ and $O_2$. Preferably, the former gas is flowed into the plasma reactor chamber at a flow rate ranging from about 2 standard cubic centimeters per minute (sccm) to about 20 sccm, the latter gas is flowed into the chamber at a rate ranging from about 0.5 sccm to about 5 sccm, while the ambient pressure ranges from about 5 millitorr to about 15 millitorr. In addition, the power density ranges from about 0.1 watts/$cm^2$ to about 0.3 watts/$cm^2$. Flow rates less than about 2 sccm (for $CHF_3$) are undesirable because they result in an undesirably low etch rate. On the other hand, flow rates greater than about 20 sccm (for $CHF_3$) are undesirable because they result in an undesirably large amount of fluorine-containing material remaining in the plasma reactor chamber (through adhesion to the chamber walls), after the $CHF_3$ is exhausted from the chamber. Flow rates less than about 0.5 sccm (for $O_2$) are undesirable because they result in an undesirably low etch rate, while flow rates greater than about 5 sccm are undesirable because they result in an undesirably large amount of erosion of the energy-sensitive region 60. Ambient pressures less than about 5 millitorr are undesirable because they produce undesirably low etch rates, while ambient pressures greater than about 15 millitorr are undesirable because they result in an undesirably large amount of fluorine-containing material remaining in the reactor chamber. Further, power densities less than about 0.1 watts/$cm^2$ are undesirable because they yield undesirably low etch rates, while power densities greater than about 0.3 watts/$cm^2$ are undesirable because they result in an undesirably large amount of erosion of the energy-sensitive region 60.

With the patterned region 50 serving as an etch mask, the region 40 is now reactive ion etched in an $O_2$-containing atmosphere. This is achieved by flowing $O_2$ into the reactor chamber at a flow rate ranging from about 5 sccm to about 20 sccm while maintaining the ambient atmosphere at a pressure ranging from about 2.5 millitorr to about 6 millitorr. In addition, the power density ranges from about 0.1 watts/$cm^2$ to about 0.3 watts/$cm^2$. A flow rate less than about 5 sccm is undesirable because it yields an undesirably low etch rate, while a flow rate greater than about 20 sccm is unnecessary because so large a flow rate saturates the plasma, i.e., no further etchant species are produced, and thus no increase in etch rate is achieved. An ambient pressure less than about 2.5 millitorr is undesirable because this produces an undesirably low etch rate, while an ambient pressure greater than about 6 millitorr is undesirable because this results in an undesirably large amount of lateral etching (undercutting) of the region 40, with a corresponding loss of linewidth control. In addition, a power density less than about 0.1 watts/$cm^2$ is undesirable because it yields an undesirably low etch rate, while a power density greater than about 0.3 watts/$cm^2$ is undesirable because it produces an undesirably large amount of lateral etching (undercutting) of the region 50.

With the patterned, planarizing region 40 serving as a mask, the substrate 10 is processed by, for example, etching, metallizing, or ion implanting the substrate 10.

EXAMPLE

The following describes the steps involved in forming and patterning a trilevel resist which includes one embodiment of the silicon dioxide substitute of the present invention.

A layer of photoresist, sold under the trade name HPR-204 by the Hunt Chemical Company of Palisades Park, N.J., was spin-deposited onto the (unprocessed) upper surface of a 4-inch silicon wafer. The thickness of the layer was measured with a Nanospec automatic film thickness gauge and found to be 1.8 μm. The photoresist-covered wafer was baked in air at 210 degrees C. for 2 hours.

A 0.06 μm-thick layer of tantalum ethoxide (material purchased from the Alfa Products Company of Danvers, Mass.) was spin-deposited onto the HPR-204 photoresist. In turn, a 0.18 μm-thick layer of a mixture of GR650 organosilicon resin (material purchased from the Owens-Illinois Company of Toledo, Ohio) and tantalum ethoxide was spin-deposited onto the tantalum ethoxide layer. The tantalum ethoxide constituted 0.24 percent (by weight) of the mixture. The resulting, coated wafer was baked in air at 210 degrees C. for 20 minutes.

To promote adhesion between the mixture (of GR650 resin and tantalum ethoxide) layer and the subsequently deposited (upper) layer of photoresist, a 0.005 μm-thick layer of tantalum ethoxide was spin-deposited onto the mixture layer. Then, a 1 μm-thick layer of HPR-204 photoresist was spin-deposited onto the tantalum ethoxide layer. The resulting, coated wafer was baked in air at 90 degrees C. for one-half hour.

A pattern of 1 μm-wide lines and spaces was defined in the top layer of HPR-204 photoresist by exposing the layer, through a mask, to light having a wavelength of 436 nanometers. The exposed photoresist layer was then developed using a wet developer sold under the trade name AZ 2401 by the American Hoechst Company of Somerville, N.J.

The pattern defined in the top photoresist layer was transferred by reactive ion etching the underlying tantalum ethoxide, mixture and tantalum ethoxide layers (while using the patterned photoresist layer as an etch mask) in an atmosphere which included 70 percent (by volume) $CHF_3$ and 30 percent air. The flow rate of the mixture of $CHF_3$ and air pumped into the etching chamber was 10 sccm, the ambient pressure was 7 microns, and the power density was 0.2 watts/cm$^2$. The etching time was 10 minutes.

The bottom layer of HPR-204 photoresist covering the wafer surface was reactive ion etched (while using the overlying, patterned layers as an etch mask) in a pure, $O_2$ atmosphere. (During this etching step, the top photoresist layer was etched away.) The flow rate of the $O_2$ gas pumped into the etching chamber was 14 sccm, the ambient pressure was 4 millitorr, and the power density was 0.2 watts/cm$^2$. Etching time was 30 minutes.

Scanning electron micrographs (SEMs) were taken of cross-sectional slices of the resist-covered wafer. These SEMs revealed that the width of the lines, at the bottom of the (bottom layer of) HPR-204 photoresist (covering the wafer surface) differed from the width of the lines at the top of the (bottom layer of) HPR-204 photoresist by less than or equal to about 10 percent. Moreover, the width of the lines at the bottom of the HPR-204 photoresist differed from 1 μm by less than or equal to 10 percent, i.e., 0.9 μm ≦ line widths ≦ 1 μm.

What is claimed is:

1. A method for fabricating a device, comprising the steps of:
   forming a resist on a substrate surface, said resist comprising a first region overlying said substrate, a second region overlying said first region, and a patterned third region overlying said second region;
   etching said second region with a second-region etchant while using said third region as an etch mask, said second-region etchant being produced by forming a plasma in a fluorine-containing gas;
   removing said fluorine-containing gas, introducing a first-region etchant, and etching said first region with said first-region etchant while using said second region as an etch mask; and
   completing the fabrication of said device, characterized in that
   said forming step includes the step of spin-depositing said second region, said second region including material substantially resistant to lateral etching by fluorine-containing etchant species present during the etching of said first region, the composition and/or thickness of said second region being chosen so that said third region is substantially unaffected by exposure to said second-region etchant during the time required to etch said second region with said second-region etchant, and the pattern etched into said third region is substantially identical to the pattern existing in said first region.

2. The method of claim 1 wherein said second region includes material containing silicon chemically bound to oxygen and metal chemially bound to oxygen.

3. The method of claim 2 wherein said second region includes first and second portions, said first portion overlying said second portion which overlies said first region, said first portion including silicon chemically bound to oxygen and said second portion including metal chemically bound to oxygen.

4. The method of claim 3 wherein said first portion also includes metal chemically bound to oxygen.

5. The method of claim 3 wherein the amount of chemically bound silicon and oxygen in said first portion is greater than or equal to about 60 percent by weight solids.

6. The method of claim 3 wherein the amount of chemically bound metal and oxygen in said second portion is greater than or equal to about 90 percent by weight solids.

7. A method for fabricating a device, comprising the steps of:
   forming a resist on a substrate surface, said resist comprising a first region overlying said substrate, a second region overlying said first region, and a patterned third region overlying said second region;
   etching said second region with a second-region etchant while using said third region as an etch mask, said second-region etchant being produced by forming a plasma in a fluorine-containing gas;
   removing said fluorine-containing gas, introducing a first-region etchant, and etching said first region with said first-region etchant while using said second region as an etch mask; and
   completing the fabrication of said device, characterized in that
   said second region includes material containing silicon chemically bound to oxygen and metal chemically bound to oxygen, the composition and/or thickness of said second region being chosen so that said third region is substantially unaffected by exposure to said second-region etchant during the time required to etch said second region with said second-region etchant, and the pattern etched into said third region is substantially identical to the pattern existing in said first region.

* * * * *